(12) United States Patent
Steudel et al.

(10) Patent No.: US 12,230,351 B2
(45) Date of Patent: Feb. 18, 2025

(54) ON-CHIP POWER REGULATION CIRCUITRY AND REGULATION METHOD THEREOF

(71) Applicant: MICLEDI MICRODISPLAYS BV, Leuven (BE)

(72) Inventors: Soeren Steudel, Herent (BE); Sean Lord, Ottawa (CA)

(73) Assignee: MICLEDI MICRODISPLAYS BV, Leuven (BE)

( * ) Notice: Subject to any disclaimer, the term of this patent is extended or adjusted under 35 U.S.C. 154(b) by 208 days.

(21) Appl. No.: 17/912,766

(22) PCT Filed: Mar. 25, 2021

(86) PCT No.: PCT/EP2021/057663
§ 371 (c)(1),
(2) Date: Sep. 19, 2022

(87) PCT Pub. No.: WO2021/191321
PCT Pub. Date: Sep. 30, 2021

(65) Prior Publication Data
US 2023/0144565 A1 May 11, 2023

(30) Foreign Application Priority Data
Mar. 25, 2020 (EP) .................................... 20165479

(51) Int. Cl.
*G11C 5/14* (2006.01)
*G11C 11/419* (2006.01)

(52) U.S. Cl.
CPC ............ *G11C 5/147* (2013.01); *G11C 11/419* (2013.01)

(58) Field of Classification Search
CPC ...... G11C 5/147; G11C 11/419; G11C 11/413; G11C 7/065; G11C 7/14; G11C 5/14; G11C 11/412
See application file for complete search history.

(56) References Cited

U.S. PATENT DOCUMENTS

| 6,011,739 A | * | 1/2000 | Baek | G11C 7/14 365/207 |
| 6,078,542 A | * | 6/2000 | Tomishima | G11C 8/14 365/230.06 |

(Continued)

FOREIGN PATENT DOCUMENTS

JP 2013200938 A 10/2013

OTHER PUBLICATIONS

International Search Report and Written Opinion for related International Application No. PCT/EP2021/057663, dated Jun. 21, 2021, 13 pages.

(Continued)

*Primary Examiner* — Mohammed A Bashar
(74) *Attorney, Agent, or Firm* — DITTHAVONG, STEINER & MLOTKOWSKI (57) ABSTRACT

A circuitry (30) for on-chip power regulation is provided. The circuitry (30) comprises a memory array (31) comprising a plurality of memory cell blocks (32) arranged in rows and columns, where the memory cell blocks are clustered into a defined number of memory cell blocks (33) along the row, each cluster (33) is connected to a respective local reference line (34). In addition, the circuitry (30) comprises a plurality of sense amplifiers (40) connected to the respective memory cell blocks (32). The circuitry (30) further comprises at least one dummy memory cell block (35) additionally arranged to each cluster of memory cell blocks (33), where the dummy memory cell block (35) is connected to a main reference line (36). Moreover, the circuitry (30)

(Continued)

comprises at least one transistor (37) arranged in between the local reference line (34) of each cluster of memory cell blocks (33) and the main reference line (36).

13 Claims, 7 Drawing Sheets

(56) References Cited

U.S. PATENT DOCUMENTS

| | | | |
|---|---|---|---|
| 6,462,998 B1* | 10/2002 | Proebsting | G11C 7/065 |
| | | | 365/194 |
| 6,483,763 B2* | 11/2002 | Uchikoba | G11C 11/4091 |
| | | | 365/205 |
| 7,126,370 B2 | 10/2006 | Bhattacharya | |
| 7,307,905 B2 | 12/2007 | Najm et al. | |
| 10,079,054 B1 | 9/2018 | Gunaratna et al. | |
| 10,331,201 B2 | 6/2019 | Steudel et al. | |
| 2011/0261629 A1* | 10/2011 | Seshadri | G11C 11/417 |
| | | | 365/189.09 |
| 2014/0092700 A1 | 4/2014 | Adams et al. | |

OTHER PUBLICATIONS

Hua et al, abstract of "Distributed Data-Retention Power Gating Techniques for cols. and Row Co-Controlled Embedded SRAM", Article, 2005 IEEE International Workshop on Memory Technology, Design, and Testing, Aug. 3, 2005, 3 pages.

Li et al, "Architecture-Level Modeling for SRAM-based Structures with Advanced Leakage Reduction techniques", Conference Paper, Nov. 2011, 10 pages.

* cited by examiner

ON-CHIP POWER REGULATION CIRCUITRY AND REGULATION METHOD THEREOF

The invention relates to on-chip power regulation of static random access memory (SRAM), especially for systems that require a large amount of SRAM, where a few percent of overall memory size is in use at any given time.

Generally, SRAM is highly used in embedded and electronic devices. Due to the static leakage and dynamic power consumption, a significant portion of the overall power consumption for an embedded system relates to the power consumption of the memory block. However, in case of sparse video projection, especially for augmented reality glasses, the power consumption is dominated by static leakage and not the dynamic read/write power consumption, since only some virtual objects are overlaid over a real landscape. The power gating technique is a known approach to reduce the static power consumption of any system, which contains multiple functional blocks that can be independently switched off depending on the usage pattern.

For example, the document U.S. Pat. No. 10,331,201 B2 discloses an integrated circuit device with an integrated power control unit for controlling the power of a power isle. The power control unit controls the on-time of the power isle through a power gating switch connected to a wakeup/sleep control circuit. Although, U.S. Pat. No. 10,331,201 B2 introduces dynamic power gating without any central control circuit, the said technique is effective for large logic blocks. Moreover, the technique requires an external memory to recover the states, which introduces additional loading to power management.

Accordingly, the object of the invention is to provide circuitry for on-chip power regulation of SRAM memory and power regulation method for the same, which can address the aforementioned limitations.

The object is solved by the features of the first independent claim for the circuitry and by the features of the second independent claim for the method. The dependent claims contain further developments.

According to a first aspect of the invention, a circuitry for on-chip power regulation is provided. The circuitry comprises a memory array comprising a plurality of memory cell blocks arranged in rows and columns, where the memory cell blocks are clustered into a defined number of memory cell blocks along the row, each cluster is connected to a respective local reference line. Herein, the number of memory cell blocks in a cluster is at least 64, preferably 128, more preferably 256.

In addition, the circuitry comprises a plurality of sense amplifiers connected to the respective memory cell blocks, especially connected between a bit-line and a bit-line bar of a respective memory cell block to perform read operations on each respective memory cell blocks. The circuitry further comprises at least one dummy memory cell block additionally arranged to each cluster of memory cell blocks, where the dummy memory cell block is connected to a main reference line. Moreover, the circuitry comprises at least one transistor arranged in between the local reference line of each cluster of memory cell blocks and the main reference line.

In this context, the transistor is configured to receive an input signal from the dummy memory cell block, thereby performing power gating of the respective cluster of memory cell blocks based on the input signal from the dummy memory cell block. Therefore, a dynamic power gating scheme is provided to reduce the static power consumption of the memory array. The memory cell blocks in a cluster share the same reference potential (e.g., block voltage) and are connected with the main reference (e.g., grid voltage) via a power gating transistor. In other words, the memory cell blocks in a cluster share the same power gating transistor. The power gating transistor has an input signal from an own memory cell block, which is preferably implemented with a Data Latch or SRAM cell. Thus, the overhead is only one SRAM cell for power gating per cluster of memory cell blocks.

According to a first preferred implementation form of said first aspect of the invention, the dummy memory cell block of a particular cluster is configured to store one bit information representing the one bit information to be read from and/or write to each memory cell block of the cluster. In addition, the transistor associated to the dummy memory cell block is configured to switch between a low resistive state and a high resistive state based on the level of the one bit information.

Preferably, the power gating transistor is operable in two states, namely a low resistive state and a high resistive state. In the low resistive state, the SRAM cell blocks work as standard memory cells without power gating, whereas in the high resistive state, the full cluster of SRAM cell blocks is switched off. This advantageously allows for superior power saving compared to existing solutions, especially in the context of sparse video projection.

According to a further preferred implementation form of said first aspect of the invention, the plurality of sense amplifiers are further arranged in groups corresponding to the cluster of memory cell blocks. In this regard, each group of sense amplifiers are connected to the respective dummy memory cell block through common signal lines, preferably through a common dummy bit-line and a common dummy bit-line bar. Hence, the sense amplifiers are also advantageously clustered with respect to the memory cell blocks for a specific power gating block.

According to a further preferred implementation form of said first aspect of the invention, each sense amplifier is configured to receive inputs from a bit-line and a bit-line bar of a respective memory cell block and is further configured to receive inputs from the dummy bit-line and the dummy bit-line bar of a respective dummy memory cell block. In addition, each sense amplifier is configured to output a value based on the inputs from the dummy bit-line and the dummy bit-line bar independently of the inputs from the bit-line and the bit-line bar of a respective memory cell block.

For instance, during power gating of a memory cluster, the dummy memory cell block or the power gating memory cell respecting the power gating transistor is set to 0. In this case, the corresponding sense amplifier on the individual memory or bit cells is forced to output a 0, independent of anything that would be measured on the bit-line and on the bit-line bar of the individual bit cells. Advantageously, having a full SRAM cluster switched-off does not mean there is no information stored, instead, the switched-off SRAM cluster signifies that all incorporated SRAM cells represent a 0.

According to a further preferred implementation form of said first aspect of the invention, each sense amplifier is further configured to compare the input corresponding to the bit-line bar to a reference potential, whereby the reference potential is sufficiently low. Hence, in an alternative mode of operation during a read action, the sense amplifier on the individual bit cells not only compares bit-line with bit-line bar but also compares bit-line bar to another reference voltage, preferably lower than the transistor threshold voltage.

According to a further preferred implementation form of said first aspect of the invention, the content to be stored in the memory array is predictable and is updated continuously with a low duty cycle. In this regard, the content to be stored in the memory array is significantly smaller compared to the size of the memory array, preferably limited to less than 5 percent, more preferably less than 2 percent of the overall size of the memory array at any given time. Further preferably, the content to be stored in the memory array is segmented corresponding to the size of the cluster of memory cell blocks. Thus, The SRAM blocks are tightly clustered where the data or content is continually updated with low duty cycle.

According to a further preferred implementation form of said first aspect of the invention, the dummy memory cell blocks are arranged in an array, whereby each array element comprises one bit information corresponding to the segmented content of respective cluster of memory cell blocks. Advantageously, the dummy memory cell blocks would form in itself a memory array of dummy bits for switching the respective power gating transistors.

According to a further preferred implementation form of said first aspect of the invention, the plurality of memory cell blocks and the dummy memory cell blocks are implemented with a static random access memory cell, preferably a six-transistor static random access memory cell. Advantageously, the minimum footprint 6T SRAM cell can be utilized without influencing the static noise margin.

According to a second aspect of the invention, a method for on-chip power regulation is provided. The method comprises the step of clustering a memory array comprising a plurality of memory cell blocks arranged in rows and columns into a defined number of memory cell blocks along the row, where each cluster is connected to a respective local reference line. In addition, the method further comprises the step of connecting a plurality of sense amplifiers to the respective memory cell blocks. The method further comprises the step of arranging at least one dummy memory cell block to each cluster of memory cell blocks, connected to a main reference line.

Moreover, the method comprises the step of arranging at least one transistor in between the local reference line of each cluster of memory cell blocks and the main reference line. In this context, the transistor is configured to receive an input signal from the dummy memory cell block, thereby performing power gating of the respective cluster of memory cell blocks based on the input signal from the dummy memory cell block.

Exemplary embodiments of the invention are now further explained with respect to the drawings by way of example only, and not for limitation. In the drawings.

Reference will now be made in detail to the embodiments of the present invention, examples of which are illustrated in the accompanying drawings. The reference numbers for similar entities are partially omitted. However, the following embodiments of the present invention may be variously modified and the range of the present invention is not limited by the following embodiments.

Figure 1:
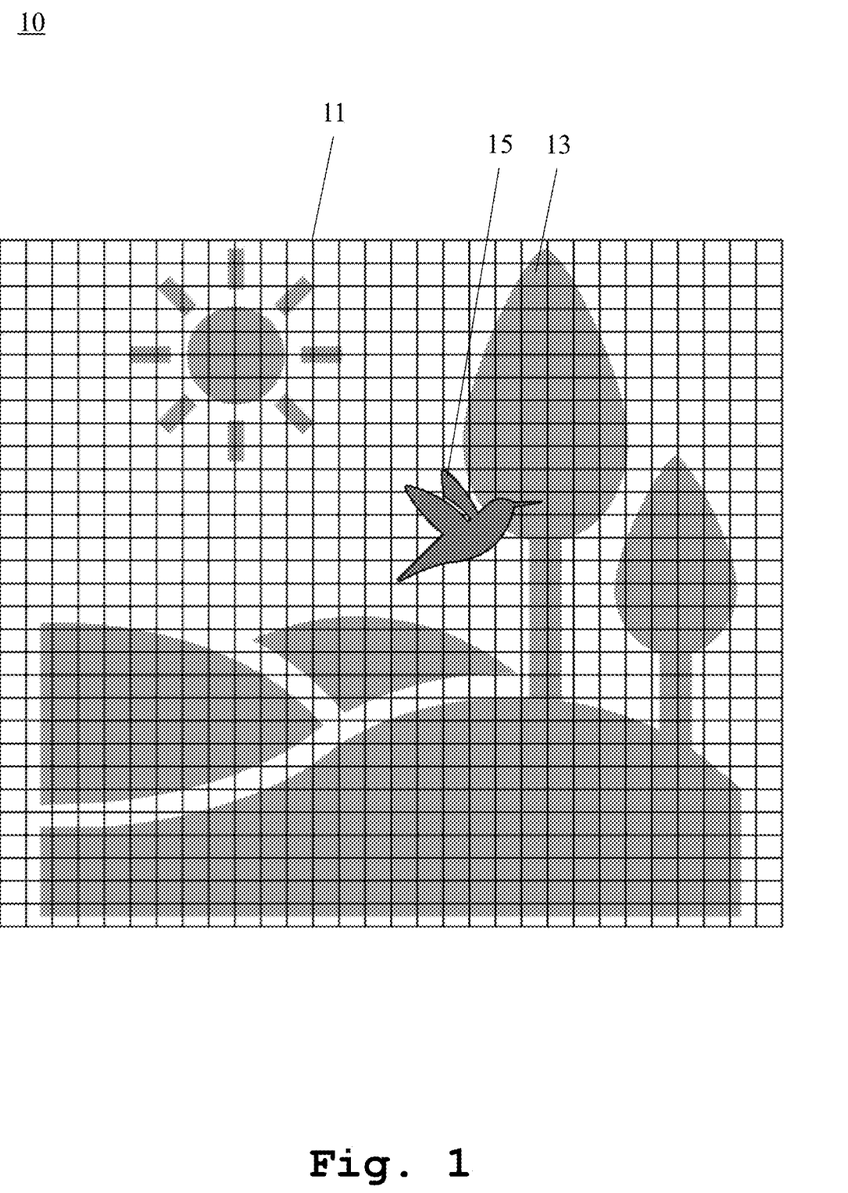
FIG. 1 shows an example of an image content in sparse video projection.

In FIG. 1, an example of a virtual image content is illustrated in the context of sparse video projection. The sparse video projection example 10 is shown for an augmented reality glass 11. However, the invention is applicable to any system that requires a large amount of SRAM, whereby the data is continually updated with a low duty cycle. Furthermore, the content can be predicted to be limited to a few percent of overall memory size in use at any given time and those used SRAM cell blocks are tightly clustered.

Generally, for the augmented reality glasses 11, only some virtual objects 15 are overlaid over a real landscape 13. If there is extensive image processing required, for instance, display uniformity or temperature calibration, bit reshuffling for pulse width modulation, and the like, the display 11 or an assorted display pre-processing IC packaged together with the display will require a large SRAM memory. This memory may contain a few frames (e.g., Full High Definition 1920×1280×3), with a high bit resolution (e.g., 8-16 bit) that is updated within a frame rate of 30-400 frames per second.

Hence, this would correspond to a memory size of greater than 100 Megabits. The power consumption is typically dominated by static leakage and not by the dynamic read/write power consumption since every SRAM cell undergoes the read/write operation once on $\frac{1}{1280}$ time intervals (e.g., for Full High Definition). Depending on which technology node is implemented and at which reference voltage or VDD the memory cell is operating (e.g., 0.6V-0.9V), it will translate into 0.1-1 watt static power consumption. Especially for mobile systems, e.g., the augmented reality glass 11 illustrated herein, this will be in fact one of the main energy consumers.

Figure 2:
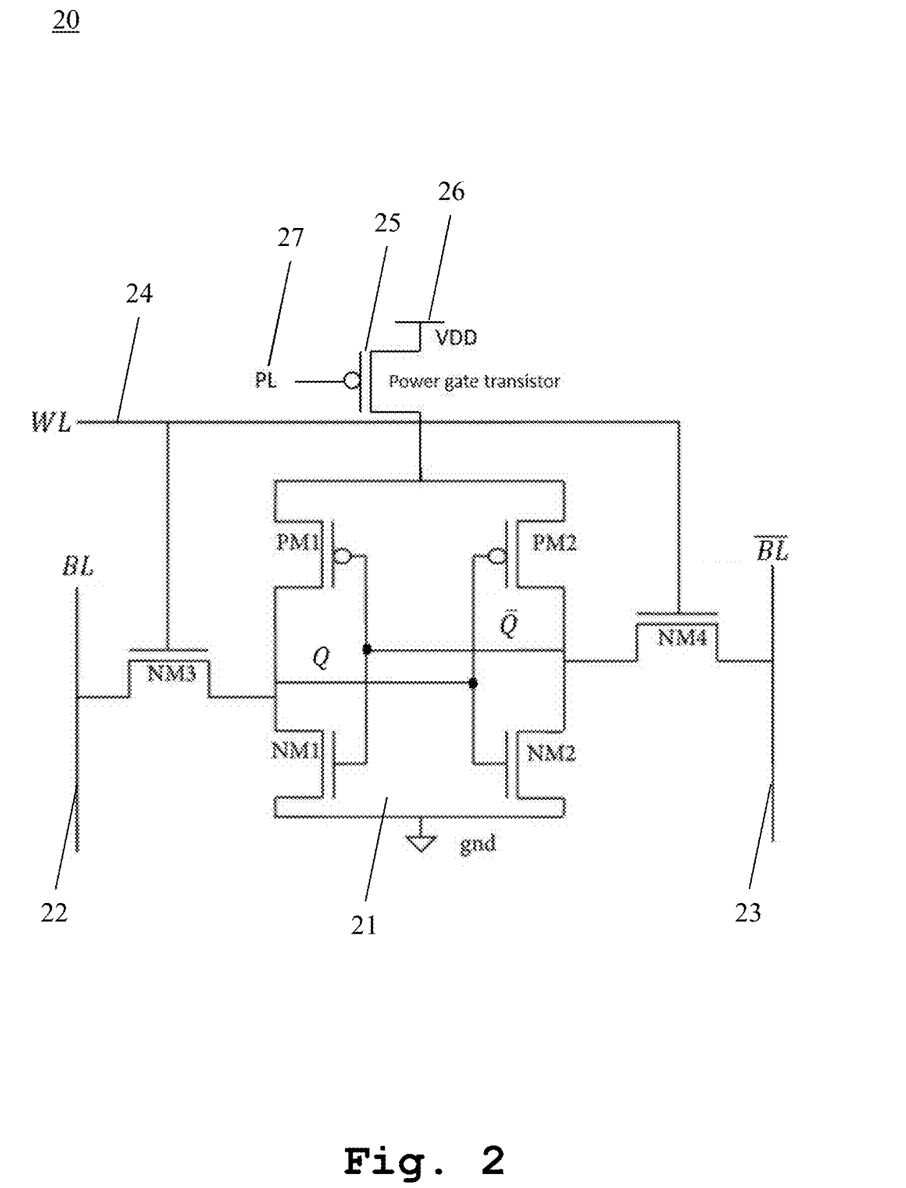
FIG. 2 shows a schematic of an SRAM cell with power gating transistor by way of an example.

In FIG. 2, a schematic of an SRAM cell with power gating transistor is illustrated by way of an example. As mentioned before, power gating for static power reduction is a known approach to reduce the static power consumption of any system, which contains multiple functional blocks that can be independently switched off depending on the usage pattern. Hereby, the whole functional block (e.g., a microcore, SRAM, DRAM, ADC) can be completely switched off by inserting a low leakage transistor in between the main grid line or VDD_grid and a local grid line or VDD_block. Since only the static power consumption is reduced and not the dynamic power consumption, such a power gating technique is commonly used in mobile phones, for instance, in the central processing unit or in the graphics processing unit where there is a very low duty cycle throughout the daily consumption patterns.

Generally, the low leakage transistor is implemented in the same process flow as the standard logic transistors but with longer channel length or even a change in the doping profile. This low leakage transistor is typically a part of the standard process design kit at any scaled node. An alternative approach can be the use of a transistor based on a different material system than the silicon front end of line (Si-FEOL) with lower leakage. In order to limit the voltage drop over this transistor during an ON operation, the width of the transistor is dimensioned to be very large so that less than 10 percent of the VDD drops over the power gating transistor.

However, the area consumption of this transistor can be significant. Furthermore, additional overhead is created since a central control unit is normally foreseen to manage the switching of the power gating transistor and there are area losses due to the power control logic and power gating transistor are in the FEOL and need to switch the VDD which is in a VDD_grid in the top metal layer. As a result, a very large Via is required. For the aforementioned reasons, power gating is normally applied to large logic blocks that contain a few $10^5$-$10^7$ transistors. Furthermore, for the most functional blocks like a micro-core, a lot of memory states would need to be recovered from an external memory. This results in the consumption of several clock cycles until the block is again functional.

Referring to FIG. 2, a power gating scheme 20 is shown, where a single SRAM cell block 21 is being power gated. The bit-lines, especially the bit-line 22 and the bit-line bar 23, and the word line 24 are also illustrated. It can be seen that the single SRAM cell block 21 is implemented as a 6T SRAM (four transistors PM1,PM2,NM1,NM2 for inverter operation and two transistors NM3,NM4 for the lines). The SRAM cell block 21 is connected to the grid 26 (VDD) through a power gating transistor 25. Appropriate power gating logic 27 is applied as input to the power gating transistor 26. As it can be seen, a p-type transistor is used herein that is connected to the VDD for power gating the SRAM cell block 21. Alternatively, an n-type transistor can be used for power gating the SRAM cell block 21 by connecting the transistor to the ground. However, it is more feasible to implement the p-tape approach since in silicon technology the p-type has mostly better leakage values. Typically, the data or content of the SRAM cell block 21 is read by measuring with a sense amplifier (not shown).

From the power gating scheme 20, it is conceivable that there are three main modes of operation. In a first mode of operation, the power gating transistor 25 is switched on, e.g., via power gating logic 27, and maintains a low resistive state. Herein, the SRAM cell block 21 works like a standard SRAM cell without any power gating. In a second mode of operation, the power gating transistor 25 is switched to an intermediate resistive value, which lowers the local VDD_block to a value sufficiently high to retain the state during non-read/write operation, e.g., from 0.9 volts to 0.6 volts. Only during the read/write operation, the power gating transistor 25 is again switched on in the low resistive state.

In a third mode of operation, the power gating transistor 25 is fully switched off and maintains a high resistive state so that the leakage current is limited by the leakage current of the power gating transistor 25 and the VDD_block is close to 0 volt. The SRAM cell block 21 does not contain any data. Commonly, the second mode of operating is implemented for power gating in order to save some static power consumption (e.g., 50-75 percent) whereby keeping the content stored in the memory. However, the third mode of operation, i.e., power gating the memory by completely switching off the power gated cells or a section of cells would drastically reduce the overall static power consumption, thereby achieving a higher percentage of power consumption than can be saved.

Figure 3:
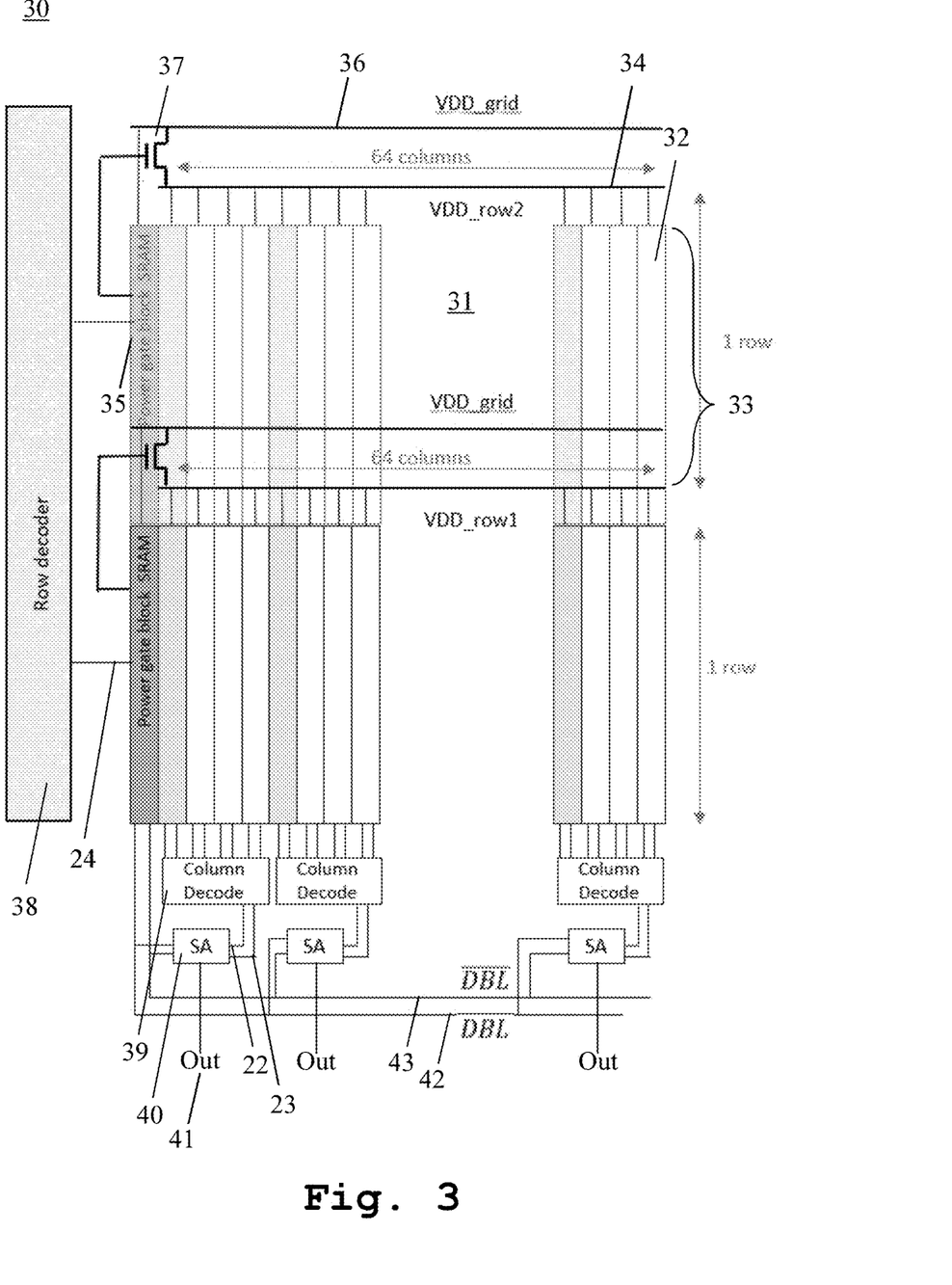
FIG. 3 shows an exemplary embodiment of the circuitry according to the first aspect of the invention.

In FIG. 3, an exemplary embodiment of the circuitry 30 according to the first aspect of the invention is illustrated. The circuitry 30 comprises a memory array 31, e.g., an SRAM array, comprising a plurality of memory cell blocks or SRAM cells 32. The SRAM cells 32 are arranged in rows and columns, where a selective number of SRAM cells 32 are clustered along the row. The cluster of memory cell blocks or the SRAM cell cluster 33 is connected to a local reference line 34, e.g., VDD_row1 resp. VDD_row2, collectively expressed herein as VDD_block.

It is conceivable that the circuitry 30 is exemplified with two SRAM cell clusters 33, each SRAM cluster 33 comprises a total of 64 SRAM cells 32 arranged along the row. Thus, each SRAM cell cluster 33 can be interpreted as a 64-bit cluster arranged in an array of SRAM cells having 64 columns and 1 row. It is further conceivable that the number of SRAM cells 32 in the array 31 can be more than 64, for instance, 128-bit cluster or even 256-bit cluster. Each SRAM cell 32 may correspond to the SRAM cell 21 illustrated in FIG. 2 having the respective bit-lines and word-line.

However, the power gating scheme is completely different with respect to the scheme illustrated in FIG. 2 in that, instead of power gating a single SRAM cell 21, a cluster 33 of SRAM cells 32 is being power gated with a single power gating transistor 37. The power gating transistor 37 is arranged between the VDD_block 34 and the main reference line or VDD_grid 36. In order to provide power gating logic to the power gating transistor 37, a dummy memory cell block or a dummy SRAM cell 35 is arranged to each SRAM cell cluster 33 that is connected to the VDD_grid 36. As such, one additional dummy bit is required to power gate a total of 64-bit SRAM cell cluster 33.

In this regard, the dummy memory cell block 35 may be referred as a secondary memory cell block or a configuration bit cell having an area of an SRAM cell, which is operable to contain information and is operable to be power gated. Although not shown in FIG. 3, it is conceivable that the circuitry 30 may additionally comprise further "dummy" memory cells preferably implemented as a symmetrical array of memory blocks outside of the memory array 31, however remain inactive during the operation. Said additional "dummy" cells advantageously assist to push the lithography and etch more to the scaling limit due to the repetitive structure. Especially, if the memory array 31 is obligated to follow a tight layout, the implementation of said memory array 31 may encounter yield issues at the border between the actual memory array and the neighboring logic. The implementation of said additional "dummy" cells advantageously allows to push the yield issues, especially caused by a transition from a repetitive structure to a non-repetitive structure to a non-functional area.

In this context, the bit information of a dummy SRAM cell 35 reflects the bit information of each SRAM cell 32 of a respective SRAM cell cluster 33. In other words, if all values in the SRAM cell cluster 33 are 0, the dummy bit is also set to 0. Based on the dummy bit level, the power gating transistor 37 switches off the respective SRAM cell cluster 33. However, even the whole SRAM cell cluster 33 is switched off, it does not mean that there is no information stored within the SRAM cell cluster 33. Instead, the dummy bit information will represent the bit information for each SRAM cell 32 of the SRAM cell cluster 33.

In order to address the respective bit-lines 22,23 and word-line 24 of an SRAM cell 32, row decoders 38 and column decoders 39 are also herein incorporated. A plurality of sense amplifiers 40 are also included, which are connected to the respective SRAM cells 32. Especially, each sense amplifier 40 is connected to the bit-lines, i.e., the bit-line 22 and the bit-line bar 23, of a respective SRAM cell 32 of an SRAM cell cluster 33. In addition, each sense amplifier 40 is further connected to the dummy bit-lines, i.e., the dummy bit-line 42 and the dummy bit-line bar 43, of the dummy SRAM cell 35 corresponding to the SRAM cell cluster 33. The output 41 of the sense amplifier 40 is fed to an input/output interface (not shown).

The properties of the power gating transistor 25 and its respective modes of operation as described along FIG. 2 are analogously applicable for the power gating transistor 37 of FIG. 3. However, by switching off an SRAM cell cluster 33 completely, for instance, according to the third mode of operation, the present solution enables for a superior power saving scheme, especially with respect to the overall static power consumption. As mentioned before, by powering down the full 64-bit cluster, the information that in this cluster only 0 are stored is contained in the dummy SRAM cell 35 connected to the power gating transistor 37, however, every single bit of this 64-bit cluster can be read as a 0.

Figure 4:
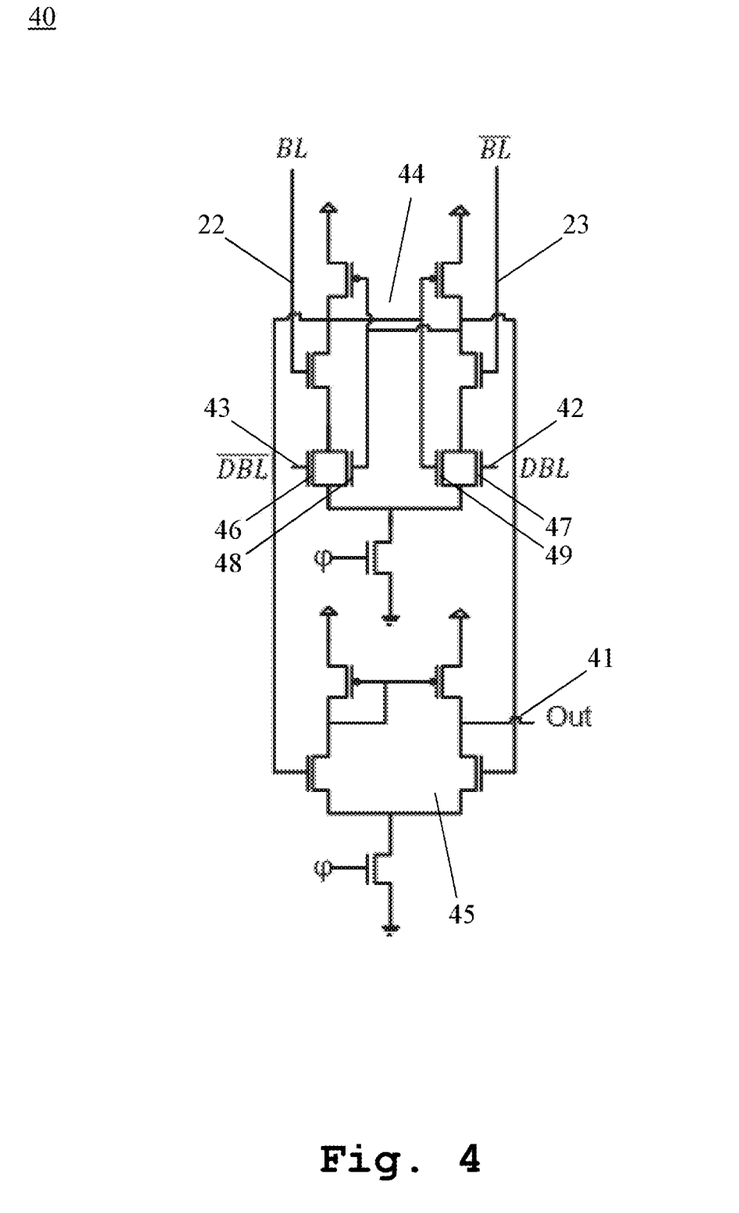
FIG. 4 shows an exemplary embodiment of the sense amplifier according to the first aspect of the invention.

In FIG. 4, an exemplary embodiment of the sense amplifier 40 is illustrated. Especially, a preferred implementation of the sense amplifier 40 is shown that can facilitate the read operations with respect to the inventive solution discussed along FIG. 3. In this essence, if the dummy SRAM cell 35 is set to 0, the sense amplifier 40 on the individual SRAM cell 32 is required to output a 0, independent of anything that would be measured on the bit-lines 22,23 of the individual SRAM cell 32.

In a conventional sense amplifier, a pair of crossed coupled inverters 44 are arranged across the bit-line 22 and the bit-line bar 23. An additional pair of crossed coupled inverters 45 are arranged in coupling with the foregoing crossed coupled inverters 44. For each respective read operation defined by the timing phase φ, the sense amplifier at the end of the two complementary bit-lines 22,23 amplifies the measured small voltages to a normal logic level. The bit from the respective memory cell is then latched 41 from the cell's sense amplifier into an I/O interface through a buffer.

However, the sense amplifier 40 comprises four additional transistors 46,47,48,49 and further fed by two additional bit-lines, namely the dummy bit-line 42 and the dummy bit-line bar 43. As such, the sense amplifier 40 is operably coupled with a respective SRAM cell 32 of an SRAM cell cluster 33 and arranged between its respective bit-lines 22,23 as well as is operably coupled with a dummy SRAM sell 35 of the SRAM cell cluster 33 via its respective dummy bit-lines 41,43.

Therefore, the readout of SRAM array 31 content can be performed by reading out only the dummy SRAM cell 35, instead of reading out each individual SRAM cell 32. For example, if the dummy bit is set to 0 due to all values in the cluster 33 are 0, the sense amplifier 40 does not perform a separate read operation for all bits in the cluster 33 but will give automatically back a 0. This effectively reduces the number of read operations and further saves a substantial amount of dynamic power consumption.

Another possible readout method can be implemented in that the sense amplifier 40 performs a read operation on the individual SRAM cell 32, however, overrules any measurement based on the bit information stored in the dummy SRAM cell 35. For example, if the dummy bit is set to 0, all measured bit information sensed at the respective sense amplifier 40 for the power gated SRAM cell cluster 33 are overruled, whether the bit stored in the individual SRAM cell 32 is 1 or 0.

Figure 5A:
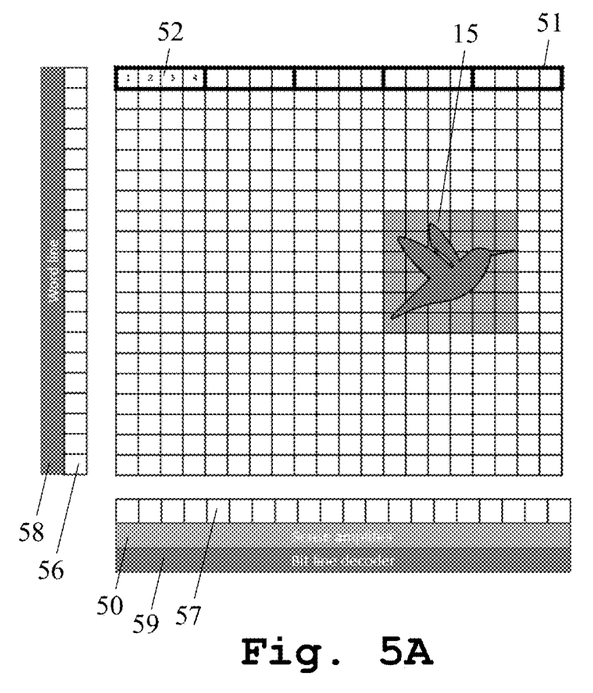
FIG. 5A shows an SRAM frame memory with a virtual image content by way of an example.
Figure 5B:
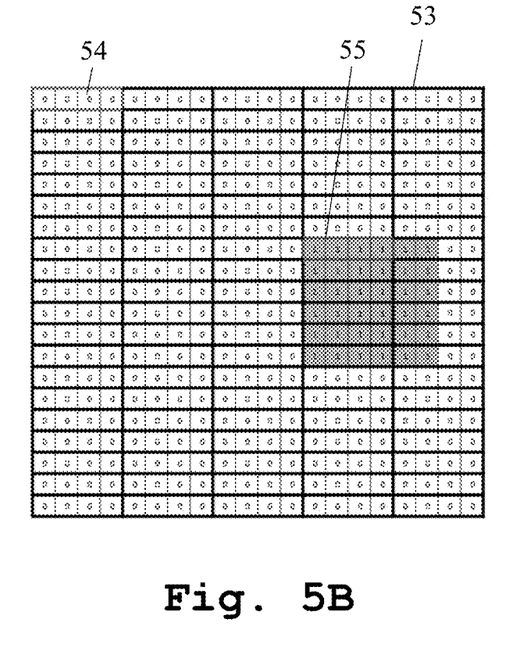
FIG. 5B shows the stored bit information in the SRAM frame memory of FIG. 5A.

Along FIG. 5A and FIG. 5B, an SRAM frame memory with a virtual image content is illustrated by way of an example. Particularly, in FIG. 5A, a simplifier frame memory 51 is shown with an indication of the virtual object 15 occupying about 5 percent of the memory. The frame memory 51 is illustrated as a 20×20 array of pixels with every pixel corresponds to 16-bit information. As such, a cluster of four pixels corresponds to the 64-bit SRAM cell cluster 33 of FIG. 3. A word-line decoder 58 that is analogous to the row decoder 38 and a bit-line decoder 59 that is analogous to the column decoder 39 are indicated as well corresponding to the word-line 24 and the bit-lines 22,23 signals of a single SRAM cell 32.

In this context, the four pixels of a cluster 52 share the same VDD_block 34 and are connected via a respective power gating transistor 37 with the VDD_grid 36. An arrangement of sense amplifiers 50 is further shown along the bit-lines 57 corresponding to the bit-lines 22,23 of individual SRAM cells 32. Herein, the pixel addressing is performed by the word-line decoder 58 via respective word-lines 56. Hence, for 16-bit grey level, the four pixels contains 64-bit information and share the same power gating transistor 37.

FIG. 5B shows the bit information respective to each pixel of the frame memory 53. It can be seen that only a few percent 55 of the total pixels contains a 1 bit, corresponding to the virtual content 15, where most of the pixels contains a 0 bit. By power gating the majority of the pixels would save a higher amount of static power consumed by the memory if the pixels containing a 0 bit can be switched off completely, however, with the expense of any information stored in these power gated pixels. The key insight of the proposed invention is that the pixels containing a 0 bit is completely switched off, but that does not mean there is no information stored. The bit information are read out of the dummy SRAM cell 35 of a respective cluster of pixels 54 while the whole cluster 54 is being switched off completely.

Figure 6:
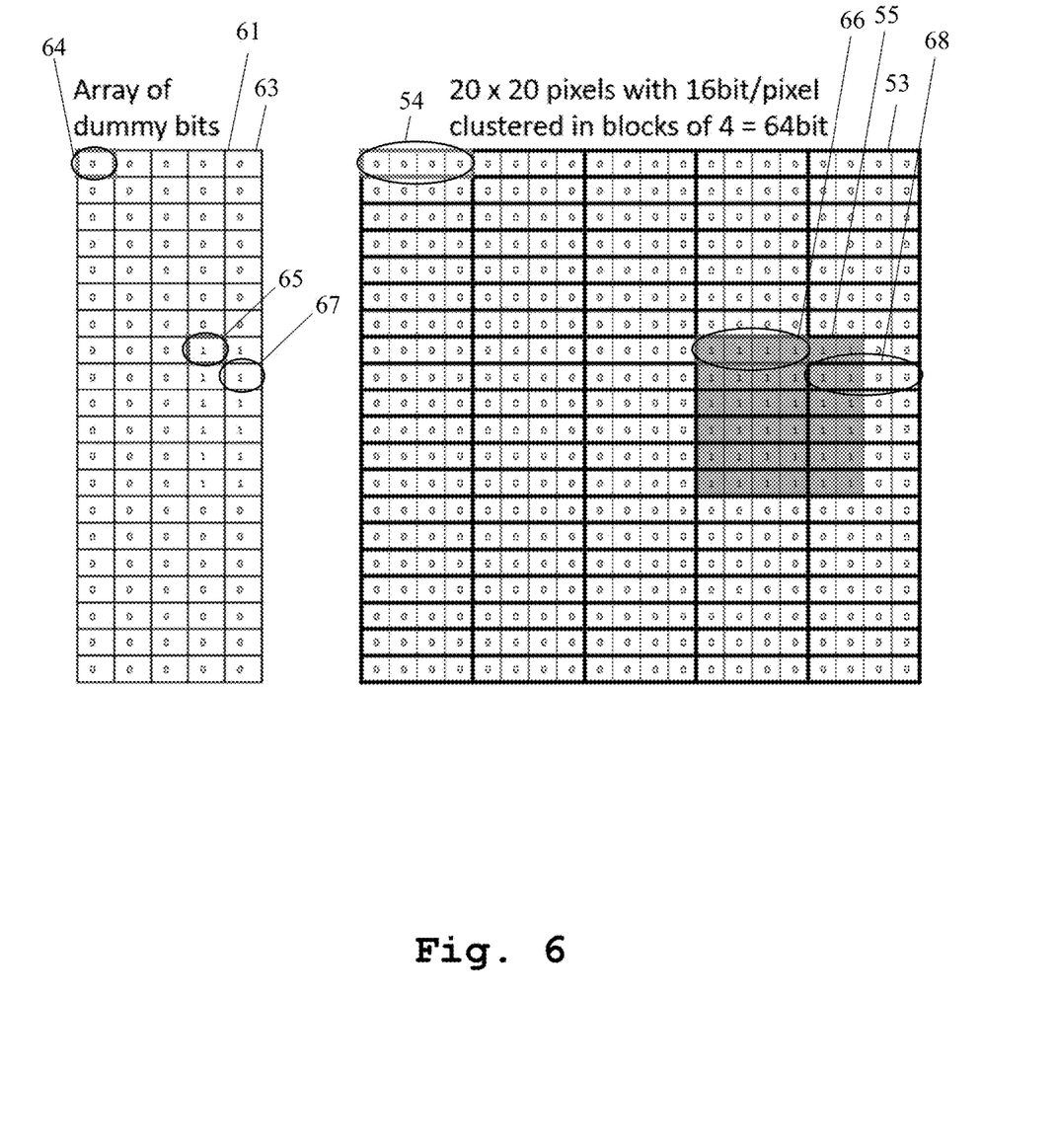
FIG. 6 shows an SRAM dummy bit array for power gating of a SRAM frame memory by way of an example.

In FIG. 6, an SRAM dummy bit array 61 or a secondary memory array or configuration bit cells for power gating of an SRAM frame memory 53 is illustrated by way of an example. It can be seen that the dummy SRAM cells 35 form in a memory array, i.e., an array of dummy bits 61, that can be used as the power gating logic in order to operate the power gating transistor 37. Each array element corresponds to a respective cluster of pixels that comprises four pixels with 16-bit per pixel. As a result, the SRAM dummy bit array 61 represents an array of actual bit information 63 with respect to the bit information 53 of the pixel clusters and hence the respective bit information of each pixel.

For instance, an array element 64 of the SRAM dummy bit array 61 would represent a 0 bit if all pixels of the respective pixel cluster 54 store a 0 bit. Similarly, for the region in the frame memory 53 comprising the bit information 55 with respect to the virtual content 15, an array element 65 would represent a 1 bit that corresponds to the pixel cluster 66 that partially stores the virtual content 15. Further, an array element 67 may represent a pixel cluster 68, where not all pixels of the cluster 68 contain the partial virtual content 15, e.g., a 1 bit, however, it does not mean that the whole cluster 68 is switched off. The pixel cluster 68 is on but the respective SRAM cell contains a 0 data.

This can be achieved by writing a 0 or 1 value in the dummy SRAM cell 35 connected to the power gating transistor 37 by predicting whether all 64-bit in the corresponding SRAM cell cluster contain a 0 or 1 value. Moreover, when all pixels of a pixel cluster, e.g., the pixel cluster 68, contains both 1 and 0 data, the respective dummy bit, e.g., dummy bit 67, for the SRAM dummy bit array 61 can be written based on a check performed on the said pixel cluster 68 to identify whether a single or more pixels contain a 1 data.

In a preferred implementation, the information arriving from the external data interface to the bit-line decoder 59 are manipulated in order to verify whether any of the SRAM cells 32 sharing the same VDD_block 34 contains any information. In this case, the input information are formulated in a defined structure so that all the input signals arrive already in a format corresponding to the length of the power gated SRAM cell cluster 33. For instance, four pixels with 16-bit per pixel are arranged in one sequence and all the non-data containing SRAM cells 32 are on low (i.e., a 0 value).

For writing the dummy bits onto the dummy SRAM cells 35 with respect to the pre-arranged and pre-formatted input information, a simple 64-bit counter with comparator is arranged before the bit-line decoder 59 that can set the dummy SRAM cells 35 with either 1 or 0. Hence, the overhead would be only one SRAM cell for power gating per 64 SRAM cell data. The same word-line decoder 58 can select the dummy bit array 61, which is only applied when the frame memory 53 is written but not when the frame memory 53 is read.

In addition, the above-mentioned read-out scheme advantageously executes read/write functions in less clock cycles compared to a conventional memory read-out scheme, therefore facilitates faster execution of said functions or perform said executions more often. Particularly, the above-mentioned read-out scheme possesses no delay in decision-making since the dummy memory cell block immediately forces the state of the sense amplifier and operates during the same clock cycle. It is further conceivable that a direct hardware link is present between the dummy memory cell block, the power-gating transistor, and the sense amplifier.

Figure 7:
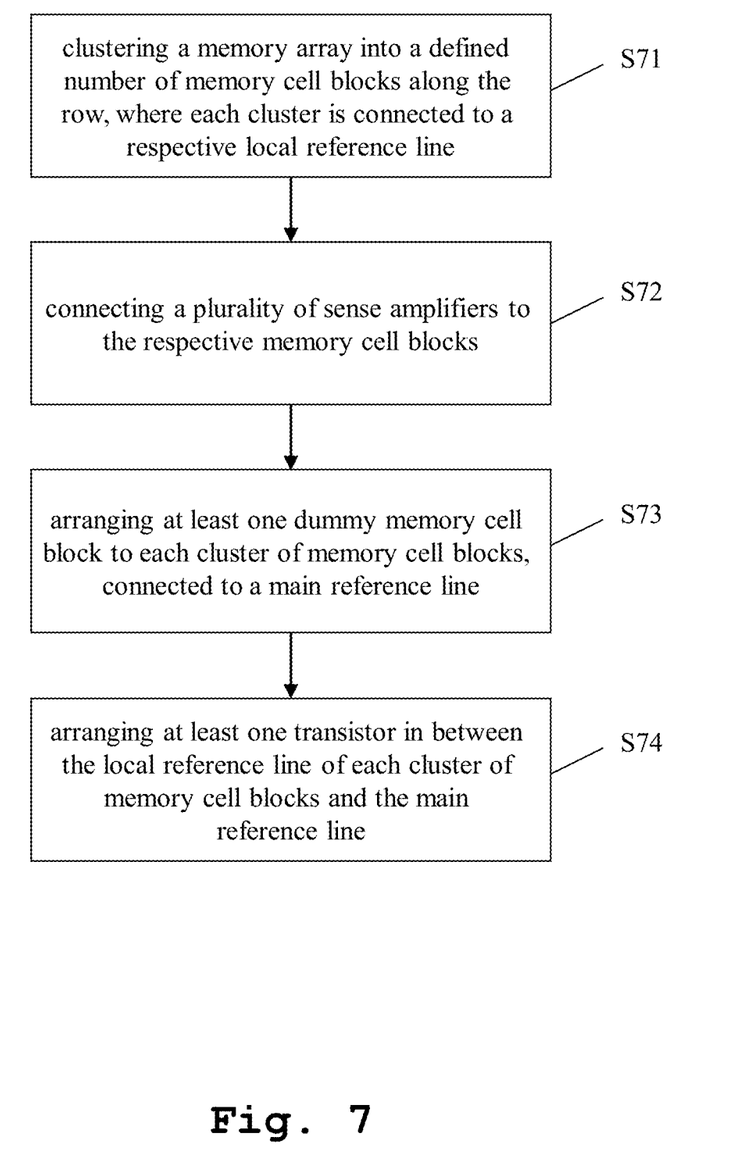
FIG. 7 shows a flow chart of an exemplary embodiment of the method according to the second aspect of the invention.

In FIG. 7, a flow chart of an exemplary embodiment of the method according to the second aspect of the invention is illustrated. In a first step S71, a memory array is clustered into a defined number of memory cell blocks along the row, where each cluster is connected to a respective local reference line. In a second step S72, a plurality of sense amplifiers are connected to the respective memory cell blocks. In a third step S73, at least one dummy memory cell block is arranged to each cluster, which is further connected to a main reference line. Finally, in a fourth step S74, at least one transistor is arranged in between the local reference line of each cluster of memory cell blocks and the main reference line.

The present invention provides a solution to reduce the static energy consumption of a large SRAM array, especially associated with the conditions for sparse video projection, and based on assumptions about the virtual content. The various implementations provided herewith are compatible with SRAM memory array, which can advantageously use the minimum footprint SRAM 6T cell size with standard voltage without lowering the noise margin or affecting the read speed. However, if the assumptions are temporary not true (e.g., tight clustering of content, sparse image, etc.), the content management is not affected at all, only the benefits of the proposed power reduction will be lost with respect to any standard SRAM implementation.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The invention claimed is:

1. A circuitry for on-chip power regulation comprising:
   a memory array comprising a plurality of memory cell blocks arranged in rows and columns, where the memory cell blocks are clustered into a defined number of memory cell blocks along the row, each cluster is connected to a respective local reference line;
   a plurality of sense amplifiers connected to the respective memory cell blocks;
   at least one dummy memory cell block additionally arranged to each cluster of memory cell blocks, connected to a main reference line; and
   at least one transistor arranged in between the local reference line of each cluster of memory cell blocks and the main reference line,
   wherein the transistor is configured to receive an input signal from the dummy memory cell block, thereby performing power gating of the respective cluster of memory cell blocks based on the input signal from the dummy memory cell block.

2. The circuitry according to claim 1,
   wherein the dummy memory cell block of a particular cluster is configured to store one bit information representing the one bit information to be read from and/or write to each memory cell block of the cluster, and
   wherein the transistor associated to the dummy memory cell block is further configured to switch between a low resistive state and a high resistive state based on the level of the one bit information.

3. The circuitry according to any of claim 1,
   wherein the plurality of sense amplifiers are further arranged in groups corresponding to the cluster of memory cell blocks.

4. The circuitry according to any of claim 1,
   wherein each group of sense amplifiers are further connected to the respective dummy memory cell block through common signal lines, preferably through a common dummy bit-line and a common dummy bit-line bar.

5. The circuitry according to any of claim 1,
   wherein each sense amplifier is configured to receive inputs from a bit-line and a bit-line bar of a respective memory cell block and is further configured to receive inputs from the dummy bit-line and the dummy bit-line bar of a respective dummy memory cell block.

6. The circuitry according to claim 5,
wherein each sense amplifier is further configured to output a value based on the inputs from the dummy bit-line and the dummy bit-line bar independently of the
inputs from the bit-line and the bit-line bar of a respective memory cell block.

7. The circuitry according to claim 5,
wherein each sense amplifier is further configured to compare the input corresponding to the bit-line bar to a reference potential, whereby the reference potential is sufficiently low.

8. The circuitry according to any of claim 1,
wherein the content to be stored in the memory array is predictable and is updated continuously with a low duty cycle.

9. The circuitry according to any of claim 1,
wherein the content to be stored in the memory array is significantly smaller compared to the size of the memory array, preferably limited to less than 5 percent, more preferably less than 2 percent of the overall size of the memory array at any given time.

10. The circuitry according to any of claim 1,
wherein the content to be stored in the memory array is segmented corresponding to the size of the cluster of memory cell blocks.

11. The circuitry according to claim 10,
wherein the dummy memory cell blocks are arranged in an array, whereby each array element comprises one bit information corresponding to the segmented content of respective cluster of memory cell blocks.

12. The circuitry according to any of claim 1,
wherein the plurality of memory cell blocks and the dummy memory cell blocks are implemented with a static random access memory cell, preferably a six-transistor static random access memory cell.

13. A method for on-chip power regulation comprising the steps of:
clustering a memory array comprising a plurality of memory cell blocks arranged in rows and columns into a defined number of memory cell blocks along the row, where each cluster is connected to a respective local reference line;
connecting a plurality of sense amplifiers to the respective memory cell blocks;
arranging at least one dummy memory cell block to each cluster of memory cell blocks, connected to a main reference line;
arranging at least one transistor in between the local reference line of each cluster of memory cell blocks and the main reference line; and
performing, by the transistor, power gating of the respective cluster of memory cell blocks based on an input signal from the dummy memory cell block.

\* \* \* \* \*